(12) United States Patent
Fu et al.

(10) Patent No.: US 10,504,934 B2
(45) Date of Patent: Dec. 10, 2019

(54) ARRAY SUBSTRATE, METHOD FOR MANUFACTURING ARRAY SUBSTRATE, AND DISPLAY PANEL

(71) Applicant: SHANGHAI TIANMA MICRO-ELECTRONICS CO., LTD., Shanghai (CN)

(72) Inventors: Jujian Fu, Shanghai (CN); Gang Liu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/218,496

(22) Filed: Dec. 13, 2018

(65) Prior Publication Data

US 2019/0115370 A1 Apr. 18, 2019

(30) Foreign Application Priority Data

Jul. 26, 2018 (CN) .......................... 2018 1 0836153

(51) Int. Cl.
*H01L 27/12* (2006.01)
*H01L 27/15* (2006.01)
*G09F 9/30* (2006.01)

(52) U.S. Cl.
CPC .......... *H01L 27/124* (2013.01); *H01L 27/127* (2013.01); *H01L 27/1218* (2013.01); *H01L 27/1222* (2013.01); *H01L 27/156* (2013.01); *G09F 9/301* (2013.01)

(58) Field of Classification Search
CPC ... H01L 27/12; H01L 27/121; H01L 27/1218; H01L 27/122; H01L 27/1222; H01L 27/124; H01L 27/127; H01L 27/15; H01L 27/156
USPC .......................................................... 257/72
See application file for complete search history.

(56) References Cited

U.S. PATENT DOCUMENTS

2016/0020226 A1\* 1/2016 Cheng ................. H01L 27/1218
257/72
2017/0294425 A1 10/2017 Kim

FOREIGN PATENT DOCUMENTS

CN 103400918 A 11/2013

\* cited by examiner

*Primary Examiner* — Monica D Harrison
(74) *Attorney, Agent, or Firm* — Kilpatrick Townsend & Stockton, LLP (57) ABSTRACT

There are provided an array substrate, a method for manufacturing an array substrate, and a display panel. The array substrate includes: a first flexible substrate including a foldable region, gate lines and data lines intersecting with each other located on a surface of the first flexible substrate, and display pixels located in regions defined by the gate lines and the data lines. Each of the display pixels includes a pixel circuit, a pixel electrode electrically connected to the pixel circuit, and a light emitting unit located on a side of the pixel electrode facing away from the first flexible substrate and electrically connected to the pixel electrode. At least in the foldable region, the pixel electrode is arranged on the same layer as a drain, a gate or an active layer of a thin film transistor of the pixel circuit.

19 Claims, 10 Drawing Sheets

ARRAY SUBSTRATE, METHOD FOR MANUFACTURING ARRAY SUBSTRATE, AND DISPLAY PANEL

The present application claims the priority to Chinese Patent Application No. 201810836153.8, titled "ARRAY SUBSTRATE, METHOD FOR MANUFACTURING ARRAY SUBSTRATE, AND DISPLAY PANEL", filed on Jul. 26, 2018 with the Chinese Patent Office, which is incorporated herein by reference in its entirety.

FIELD

The present disclosure relates to the field of display, and particularly to an array substrate, a method for manufacturing an array substrate, and a display panel.

BACKGROUND

With the continuous development of the display technology, the flexible display panels attract much attention, and the organic light-emitting diode (OLED) display panels are widely applied in the flexible display panel technology due to being self-luminous, having high contrast, and being bendable.

Compared with conventional liquid crystal display (LCD) display panels, the OLED display panels have higher manufacturing cost and greater manufacturing difficulty. In order to reduce the manufacturing difficulty of the flexible display panel, the Micro-LED display panels are developed due to having lower manufacturing cost, less manufacturing difficulty, higher brightness, higher luminous efficiency and lower power consumption than the OLED display panels, while being bendable.

However, a large stress is applied to a pixel electrode in the Micro-LED display panel during the bending process, and a light emitting unit bonded with the pixel electrode easily peels off due to the large stress, which results in a defective pixel in the Micro-LED display panel, and reduces the display effect of the Micro-LED display panel.

SUMMARY

There are provided an array substrate, a method for manufacturing an array substrate, and a display panel in the present disclosure.

The array substrate provided in the present disclosure includes a first flexible substrate, multiple gate lines and multiple data lines intersecting with each other on a surface of the first flexible substrate, and display pixels located in regions defined by the multiple gate lines and the multiple data lines. The first flexible substrate includes a foldable region. Each of the display pixels includes a pixel circuit, a pixel electrode electrically connected to the pixel circuit, and a light emitting unit located on a side of the pixel electrode facing away from the first flexible substrate. The light emitting unit is electrically connected to the pixel electrode. At least in the foldable region, the pixel electrode and a drain of a thin film transistor of the pixel circuit are arranged on a same layer, or the pixel electrode and a gate of the thin film transistor of the pixel circuit are arranged on a same layer, or the pixel electrode and an active layer of the thin film transistor of the pixel circuit are arranged on a same layer.

The display panel provided in the present disclosure includes the array substrate described above, and a counter substrate opposite to the array substrate.

The method for manufacturing an array substrate provided in the present disclosure includes: providing a first flexible substrate, where the first flexible substrate includes a foldable region; and forming multiple gate lines and multiple data lines intersecting with each other on a surface of the first flexible substrate and forming display pixels in regions defined by the multiple gate lines and the multiple data lines. Each of the display pixels includes a pixel circuit, a pixel electrode electrically connected to the pixel circuit, and a light emitting unit located on a side of the pixel electrode facing away from the first flexible substrate. The light emitting unit is electrically connected to the pixel electrode. At least in the foldable region, the pixel electrode and a drain of a thin film transistor of the pixel circuit are arranged on a same layer, or the pixel electrode and a gate of the thin film transistor of the pixel circuit are arranged on a same layer, or the pixel electrode and an active layer of the thin film transistor of the pixel circuit are arranged on a same layer.

It can be seen from the above that, in the array substrate, the method for manufacturing an array substrate, and the display panel according to the embodiments of the present disclosure, the first flexible substrate of the array substrate includes a foldable region. At least in the foldable region, the pixel electrode is arranged on the same layer as the drain, the gate or the active layer of the thin film transistor of the pixel circuit, to decrease a distance between the pixel electrode and the first flexible substrate, so as to decrease a distance between the pixel electrode and a neutral plane. In this way, a distance between a bonding position between the light emitting unit and the pixel electrode and the neutral plane can be decreased, such that the bending stress at the bonding position between the light emitting unit and the pixel electrode during the bending process can be reduced, and a probability that the light emitting unit peels off from the pixel electrode during the use can be decreased, thereby improving the stability and the durability of the array substrate.

BRIEF DESCRIPTION OF THE DRAWINGS

In order to more clearly illustrate embodiments of the present disclosure, the drawings to be used in the description of the embodiments are briefly described below.

DETAILED DESCRIPTION OF EMBODIMENTS

The technical solutions in the embodiments of the present disclosure are described clearly and completely in conjunction with the drawings in the embodiments of the present disclosure hereinafter. It is apparent that the described embodiments are only some embodiments of the present disclosure, rather than all embodiments.

Figure 1:
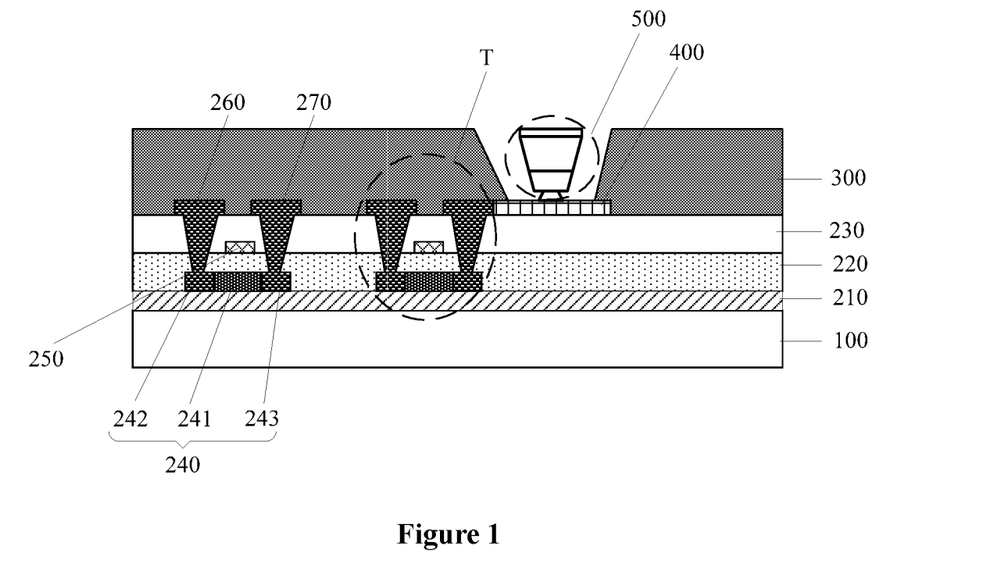
FIG. 1 is a schematic sectional view of an array substrate according to an embodiment of the present disclosure.
Figure 2:
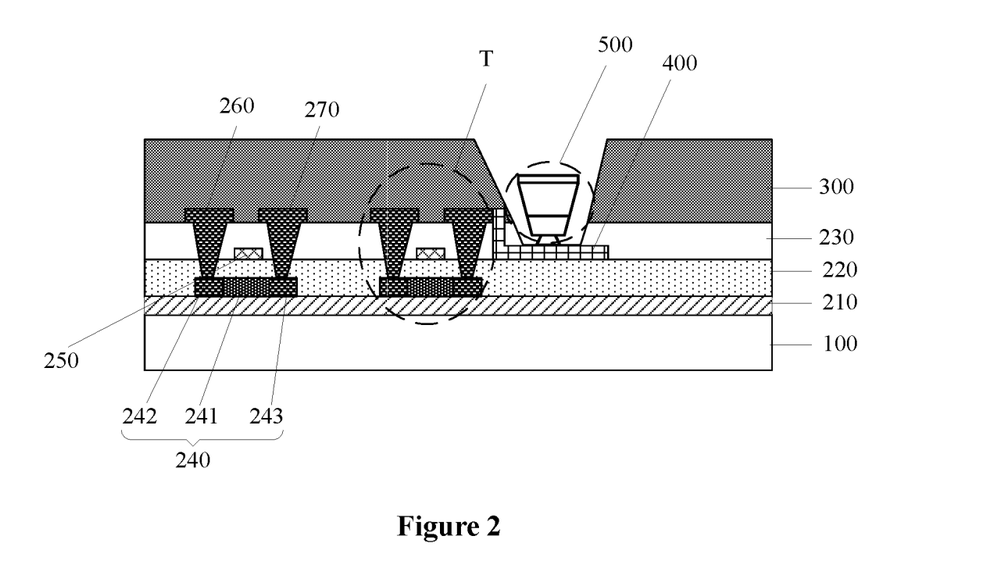
FIG. 2 is a schematic sectional view of an array substrate according to another embodiment of the present disclosure.
Figure 3:
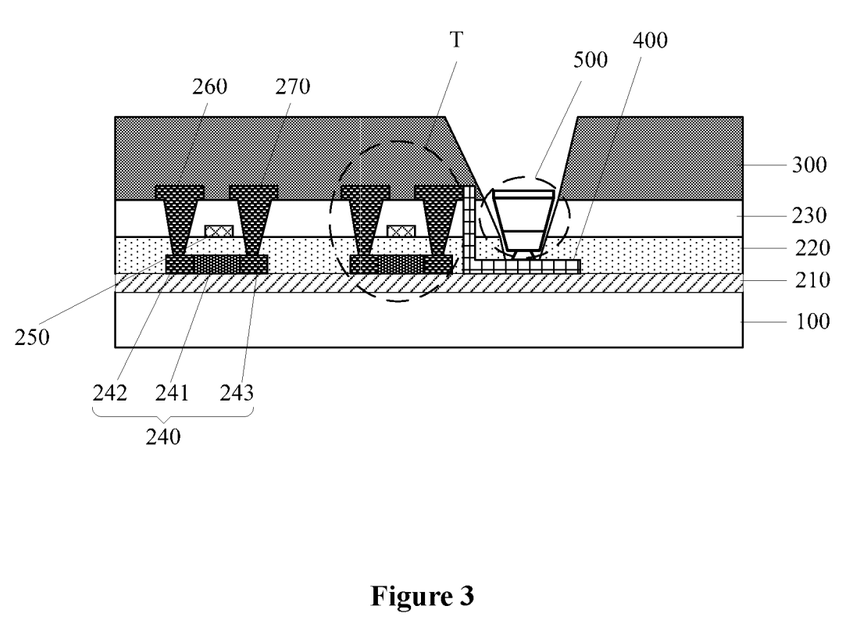
FIG. 3 is a schematic sectional view of an array substrate according to another embodiment of the present disclosure.
Figure 4:
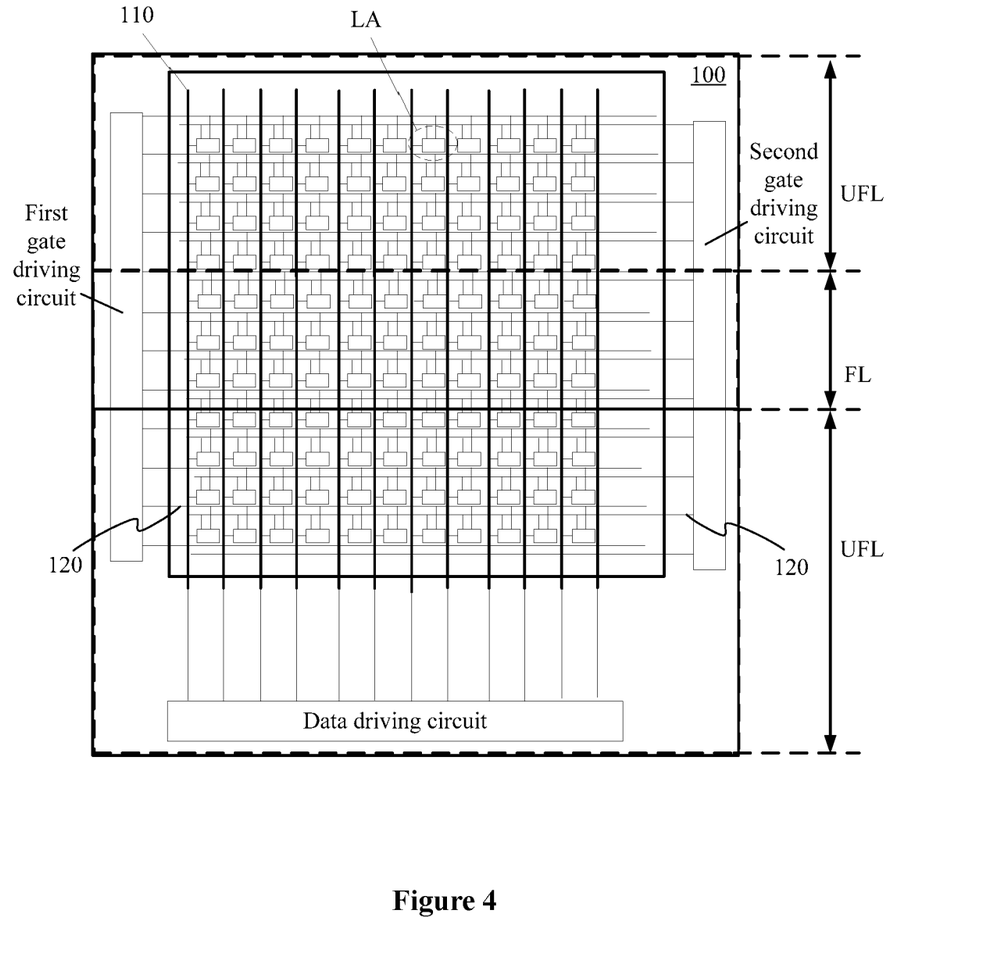
FIG. 4 is a schematic top view of a first flexible substrate according to an embodiment of the present disclosure.

Referring to FIG. 1, FIG. 2, FIG. 3 and FIG. 4, an array substrate is provided according to an embodiment of the present disclosure. FIG. 1, FIG. 2 and FIG. 3 show possible structures of the array substrate, and FIG. 4 shows a first flexible substrate and structures on a surface of the first flexible substrate.

The array substrate includes a first flexible substrate 100. The first flexible substrate 100 includes a foldable region FL.

The array substrate further includes multiple gate lines 120 and multiple data lines 110 intersecting with each other located on a surface of the first flexible substrate 100.

The array substrate further includes display pixels LA located in regions defined by the multiple gate lines 120 and the multiple data lines 110. Each of the display pixels LA includes a pixel circuit, a pixel electrode 400 electrically connected to the pixel circuit, and a light emitting unit 500 located on a side of the pixel electrode 400 facing away from the first flexible substrate 100. The light emitting unit 500 is electrically connected to the pixel electrode 400.

As shown in FIG. 1, at least in the foldable region, the pixel electrode 400 is arranged on the same layer as a drain 270 of a thin film transistor T of the pixel circuit 400.

In one embodiment, as shown in FIG. 2, at least in the foldable region, the pixel electrode 400 is arranged on the same layer as a gate 250 of the thin film transistor T of the pixel circuit 400.

In one embodiment, as shown in FIG. 3, the pixel electrode 400 is arranged on the same layer as an active layer 240 of the thin film transistor T of the pixel circuit 400.

FIG. 4 further shows a first gate driving circuit and a second gate driving circuit electrically connected to the gate lines 120, and a data driving circuit electrically connected to the data lines 110. The gate driving method illustrated in FIG. 4 is illustrative, and other gate driving methods such as a unilateral driving method or a bilateral driving method may be used, in addition to the cross driving method shown in FIG. 4.

FIG. 4 further shows a relative position between the foldable region FL and a non-foldable region UFL. After an assembling process is completed, the foldable region FL can be bended at a certain angle by using an auxiliary bending device, while the non-foldable region UFL may not be bent. Theoretically, any position on the array substrate may serve as the foldable region FL. If the auxiliary bending device that can be bended at any position is provided for the array substrate, the first flexible substrate 100 may include only the foldable region FL, but does not include the non-foldable region UFL.

At least two metal layers are generally arranged on a substrate of the array substrate. In the case of two metal layers, the two metal layers are sequentially stacked from a surface of the first flexible substrate 100, which are respectively referred to as a first metal layer and a second metal layer. The first metal layer is located between the second metal layer and the first flexible substrate 100. For some array substrates having a touch function, a third metal layer may be arranged on a side of the second metal layer facing away from the first metal layer.

The metal layers are arranged to form conductive structures such as wiring or electrodes on the array substrate. Taking a liquid crystal display panel as an example, the gate 250 of the thin film transistor T of the pixel circuit and the gate lines 120 are formed by the first metal layer, and a source 260 and the drain 270 of the thin film transistor T and the data lines 110 are formed by the second metal layer. For a liquid crystal display panel having the touch function, the third metal layer is arranged to form touch wiring. A possible film layer relationship between structures such as the gate 250, the source 260 and the drain 270 of the thin film transistor T is illustrated in the above description, which is not limited in the present disclosure and may be determined according to actual situations.

The pixel electrode 400 is required to be electrically connected with the drain 270 of the thin film transistors T in the pixel circuit. In the array substrates shown in FIGS. 2 and 3, since the pixel electrode 400 is not located on the same layer as the drain 270 of the thin film transistor T, a drilling process is performed on an insulating layer between the active layer 240 and the second metal layer (FIG. 3), or on an insulating layer between the gate 250 and the second metal layer (FIG. 2), such that the pixel electrode 400 can be electrically connected with the drain 270 of the thin film transistor T through a via hole formed by the drilling process.

In the array substrate shown in FIG. 1, since the pixel electrode 400 is located on the same layer as the source 260 and the drain 270 of the thin film transistor T, the pixel electrode 400 can be electrically connected with the drain 270 of the thin film transistor T by a patterning process without performing a drilling process, which simplifies the manufacturing process of the array substrate.

It should be noted that, in FIG. 1, FIG. 2 and FIG. 3, a thin film transistor T with a top gate structure is illustrated by way of example. In the case of bottom gate structure, reference is made to FIG. 5, FIG. 6, and FIG. 7, which show possible structures of the array substrate. In the structure illustrated in FIG. 5, at least in the foldable region FL, the pixel electrode 400 is arranged on the same layer as the drain 270 of the thin film transistor T of the pixel circuit. In one embodiment, in the structure illustrated in FIG. 6, at least in the foldable region FL, the pixel electrode 400 is arranged on the same layer as the gate 250 of the thin film transistor T of the pixel circuit. In one embodiment, in the structure illustrated in FIG. 7, at least in the foldable region FL, the pixel electrode 400 is arranged on the same layer as the active layer 240 of the thin film transistor T of the pixel circuit.

It should be noted that in the array substrate applied to a bendable flexible display panel, a plane having no strain during the bending process is defined as a neutral plane, and the neutral plane is generally close to a plane where the first flexible substrate 100 of the array substrate is located. With being close to the neutral plane, the strain of a film layer is decreased and a stress generated due to the strain is decreased during the bending process. Whether in the thin film transistor T with the top gate structure or in the thin film transistor T with the bottom gate structure, both the active layer 240 and the gate 250 of the thin film transistor T are closer to the first flexible substrate 100 than the source 260 and the drain 270 of the thin film transistor T. Therefore, the pixel electrode 400 in each of the array substrates illustrated in FIG. 2, FIG. 3, FIG. 6 and FIG. 7 is closer to the first flexible substrate 100 than that illustrated in FIG. 1 and FIG. 5, that is, the pixel electrode 400 in FIG. 2, FIG. 3, FIG. 6 and FIG. 7 is closer to the neutral plane than that in FIG. 1 and FIG. 5. In this way, the bending stress at a bonding position between the light emitting unit 500 and the pixel electrode 400 during the bending possess can be reduced.

In addition, since a thin film transistor T and a pixel electrode 400 in the non-foldable region of the first flexible substrate 100 are not required to be bended, the thin film transistor T and the pixel electrode 400 may be implemented by those in the conventional technology or may be implemented as shown in FIGS. 1 to 7, which are not limited in the present disclosure and may be determined according to actual situations.

It should further be noted that, in an OLED display panel or a Micro-LED display panel, no backlight structure is required to cause the display pixel to emit light, and thus no metal light shielding layer is provided between an active layer 240 and a first flexible substrate 100 in an array substrate of the OLED display panel or the Micro-LED display panel to shield a channel in the active layer 240. In some embodiments of the present disclosure, the pixel electrode 400 may be formed by additionally arranging a metal layer between the first flexible substrate 100 and the active layer 240, such that the pixel electrode 400 is located between the flexible substrate 100 and the active layer 240.

The thin film transistor T with the bottom gate structure and the thin film transistor T with the top gate structure are respectively described below. In a case that the thin film transistor T has the top gate structure, referring to the FIG. 1, FIG. 2 and FIG. 3, the thin film transistor T includes a buffer layer 210 located on a side of the first flexible substrate 100.

The thin film transistor T further includes an active layer 240 located on a side of the buffer layer 210 facing away from the first flexible substrate 100, and a gate insulating layer 220 covering the active layer 240. The active layer 240 includes a channel region 241, and a source region 242 and a drain region 243 located on two sides of the channel region 241.

The thin film transistor T further includes a gate 250 located on a side of the gate insulating layer 220 facing away from the first flexible substrate 100, and an interlayer insulating layer 230 covering the gate 250.

The thin film transistor T further includes a source 260 and a drain 270 located on a side of the interlayer insulating layer 230 facing away from the first flexible substrate 100. The source 260 is electrically connected to the source region 242, and the drain 270 is electrically connected to the drain region 243.

Figure 5:
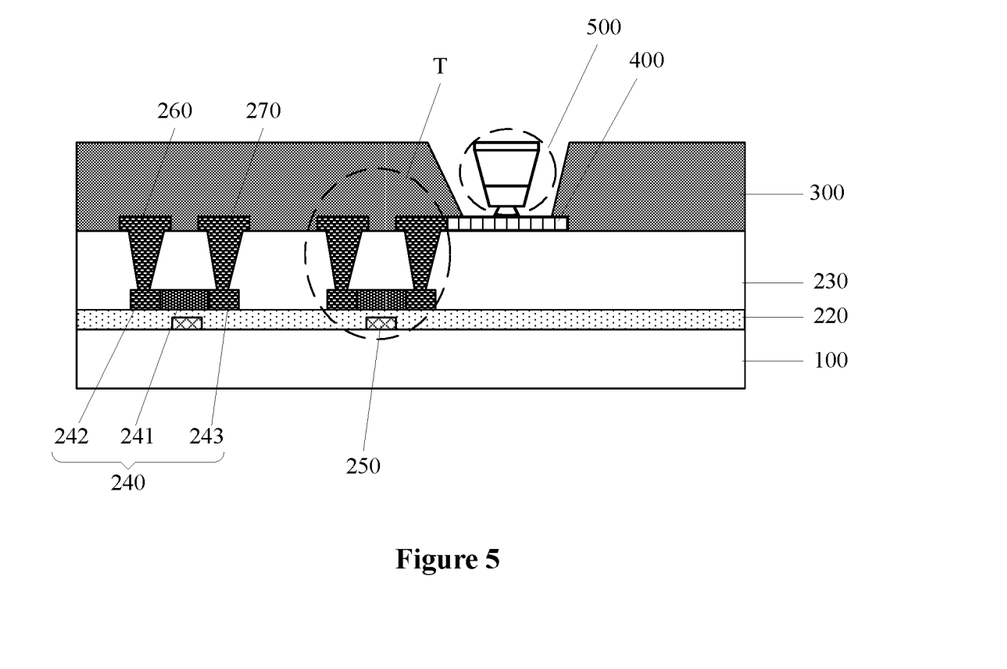
FIG. 5 is a schematic sectional view of an array substrate according to an embodiment of the present disclosure.
Figure 6:
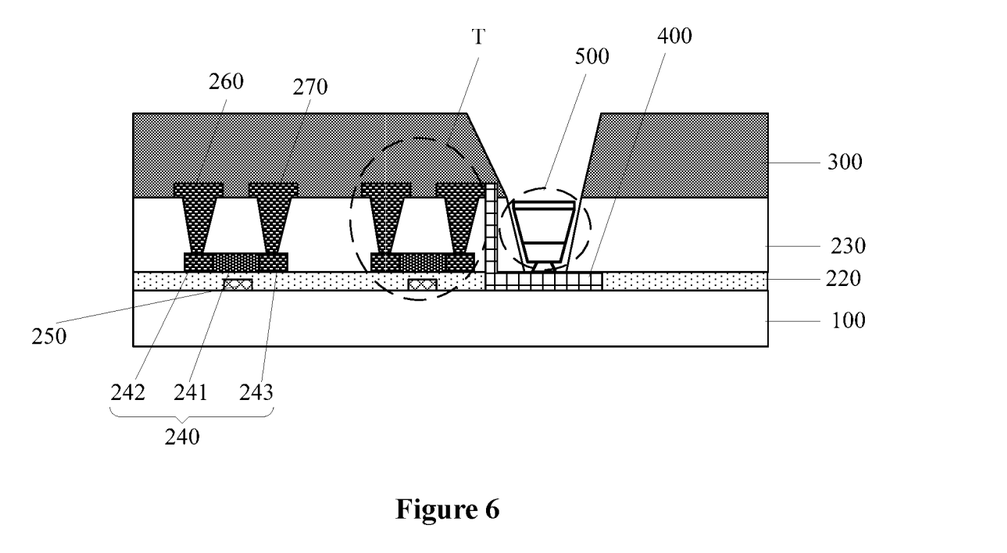
FIG. 6 is a schematic sectional view of an array substrate according to another embodiment of the present disclosure.
Figure 7:
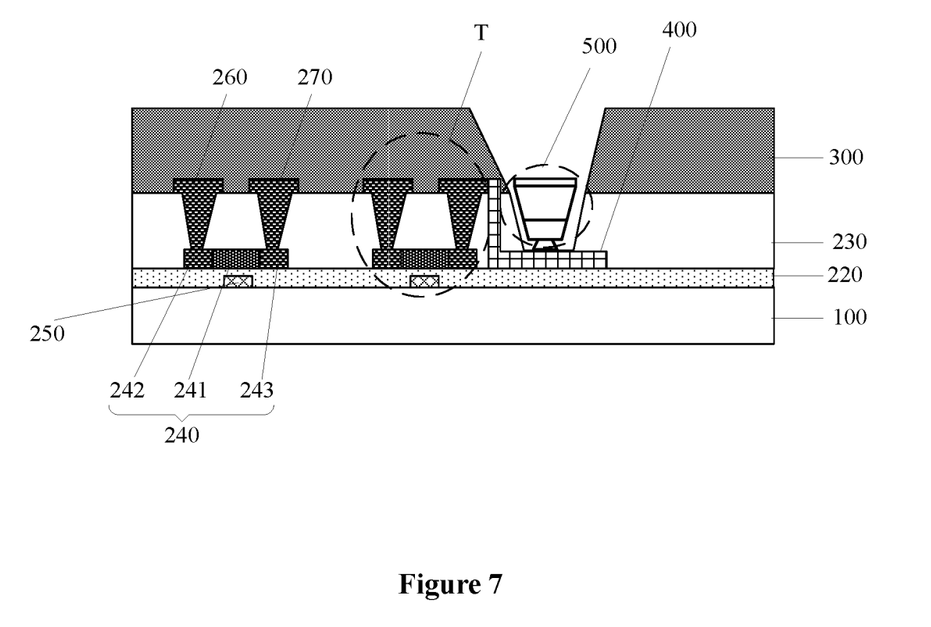
FIG. 7 is a schematic sectional view of an array substrate according to another embodiment of the present disclosure.

In a case that the thin film transistor T has the bottom structure, referring to FIG. 5, FIG. 6 and FIG. 7, the thin film transistor T includes: a gate 250 located on a side of the first flexible substrate 100, and a gate insulating layer 220 covering the gate 250.

The thin film transistor T further includes an active layer 240 located on a side of the gate insulating layer 220 facing away from the first flexible substrate 100, and an interlayer insulating layer 230 covering the active layer 240. The active layer 240 includes a channel region 241, and a source region 242 and a drain region 243 located on two sides of the channel region 241.

The thin film transistor T further includes a source 260 and a drain 270 located on a side of the interlayer insulating layer 230 facing away from the first flexible substrate 100. The source 260 is electrically connected to the source region 242, and the drain 270 is electrically connected to the drain region 243.

It should be noted that, since a film layer where the active layer 240 is located is a semiconductor material layer, ions are implanted at a position of the semiconductor material forming the pixel electrode 400 in a case that the pixel electrode 400 is arranged on the same layer as the active layer 240 of the thin film transistor T of the pixel circuit, to enhance conductivity of the semiconductor material forming the pixel electrode 400. That is, the pixel electrode 400 is a semiconductor electrode, and a carrier concentration of the semiconductor electrode is higher than a carrier concentration of the active layer 240.

In the array substrates illustrated in FIG. 1 to FIG. 7, a planarization layer 300 is arranged on a side of the pixel circuit facing away from the first flexible substrate 100. With the planarization layer 300, an entire surface of the array substrate can be flat, and a subsequent film layer can be easily formed on the planarization layer 300, to form the display panel. In addition, the planarization layer 300 arranged on the side of the pixel circuit facing away from the first flexible substrate 100 may be reused as a well layer of the array substrate, to release a stress applied to the planarization layer 300 and the film layer where the pixel circuit is located during the bending process.

Figure 8:
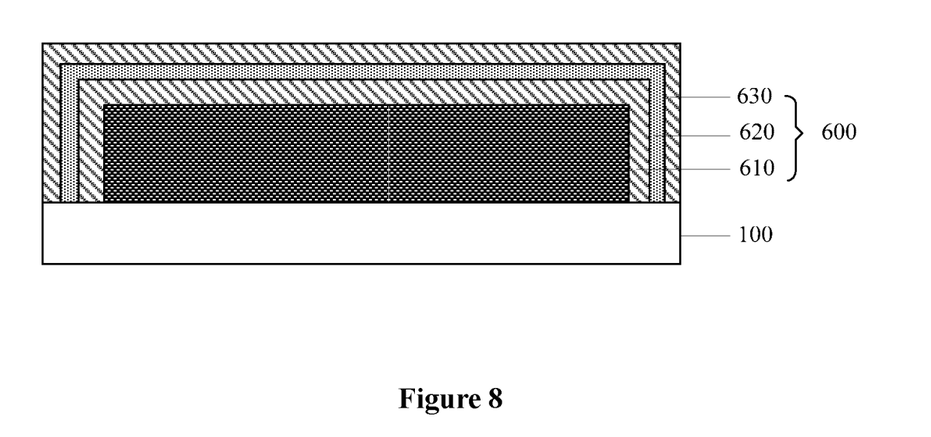
FIG. 8 is a schematic sectional view of an array substrate according to another embodiment of the present disclosure.

In order to improve dustproof, waterproof and anti-oxidation performances of film layer structures of the array substrate, reference is made to FIG. 8, which is a schematic sectional view of an array substrate. The array substrate further includes a thin film encapsulation 600 located on a side of the first flexible substrate 100. The thin film encapsulation 600 is configured to encapsulate the multiple gate lines, the multiple data lines, the display pixels and the planarization layer.

The thin film encapsulation (TFE) is generally a three-layer structure, including a first inorganic encapsulation film 610 close to the first flexible substrate 100, an organic encapsulation film 620 located on a side of the first inorganic encapsulation film 610 facing away from the first flexible substrate 100, and a second inorganic encapsulation film 630 located on a side of the organic encapsulation film 620 facing away from the first flexible substrate 100. The thin film encapsulation 600 is also bendable. The array substrate can be bended by using the thin film encapsulation 600 and the first flexible substrate 100.

The light emitting unit 500 is described in detail below. In an embodiment, the light emitting unit 500 may be a vertical LED or a horizontal LED.

Figure 9:
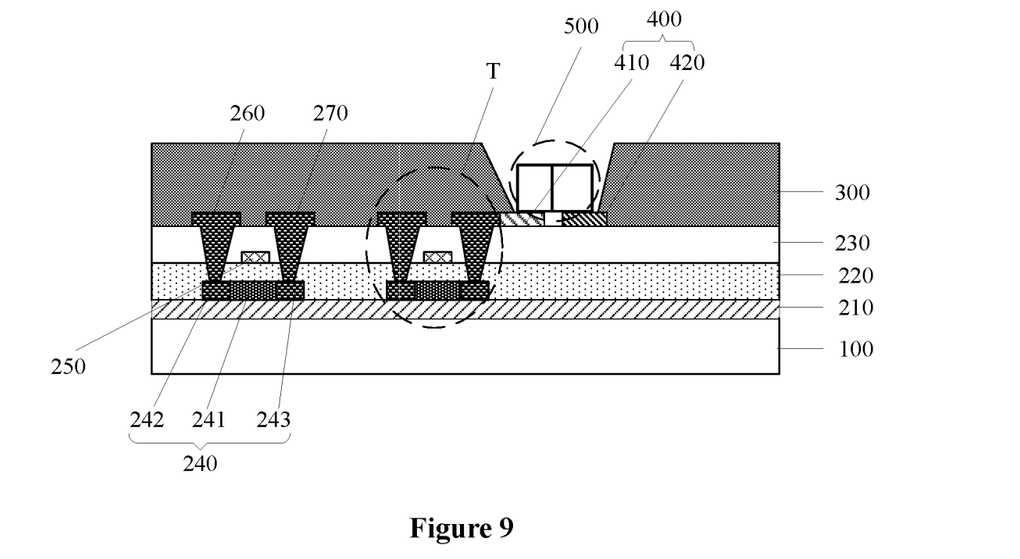
FIG. 9 is a schematic sectional view of an array substrate according to an embodiment of the present disclosure.

In a case that the light emitting unit 500 is a horizontal LED, reference is made to FIG. 9, which is a schematic sectional view of an array substrate. The pixel electrode 400 includes a first sub-electrode 410 and a second sub-electrode 420.

The first sub-electrode 410 is arranged on the same layer as the second sub-electrode 420. One side of the first sub-electrode 410 is electrically connected to a drain 270 of the thin film transistor T, and the other side of the first sub-electrode 410 is electrically connected to an anode of the light emitting unit 500.

The second sub-electrode 420 is electrically connected to a cathode of the light emitting unit 500.

For the horizontal LED, since the anode and the cathode of the horizontal LED are located on a same plane parallel to the first flexible substrate 100, the first sub-electrode 410 and the second sub-electrode 420 are required to be arranged on a same layer to serve as the anode and the cathode of the horizontal LED respectively. Further, due to factors such as the manufacturing process and a work function of an electrode, the first sub-electrode 410 may be a conductive thin film electrode formed by a conductive film, and the second sub-electrode 420 is required to be a metal electrode.

Figure 10:
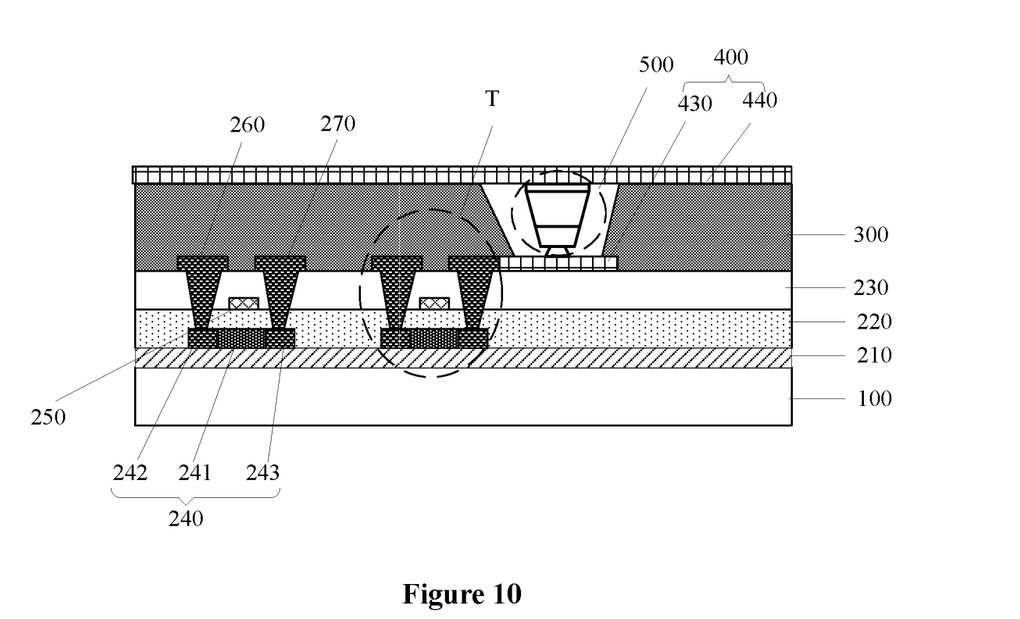
FIG. 10 is a schematic sectional view of an array substrate according to another embodiment of the present disclosure.

In a case that the light emitting unit 500 is a vertical LED, reference is made to FIG. 10, which is a schematic sectional view of an array substrate. The pixel electrode 400 includes a third sub-electrode 430 and a fourth sub-electrode 440 opposite to each other.

One side of the third sub-electrode 430 is electrically connected to a drain 270 of the thin film transistor T, and the other side of the third sub-electrode 430 is electrically connected to an anode of the light emitting unit 500.

The fourth sub-electrode 440 is arranged on a side of the light emitting unit 500 facing away from the pixel circuit, and is electrically connected to a cathode of the light emitting unit 500.

For the vertical LED, since the anode and the cathode of the vertical LED are arranged opposite to each other and are located on different planes, the third sub-electrode 430 and the fourth sub-electrode 440 are required to be arranged opposite to each other to serve as the anode and the cathode of the vertical LED respectively. In the structure having the vertical LED, since the third sub-electrode 430 and the fourth sub-electrode 440 are not required to be arranged on a same layer, both the third sub-electrode 430 and the fourth sub-electrode 440 may be conductive thin film electrodes.

In a case that a size of the light emitting unit 500 is less than or equal to 10 μm×10 μm, the vertical LED performs better than the horizontal LED. Further, since electrodes of the vertical LED as the anode and cathode may be conductive thin film electrodes, which have higher light transmittance compared with the metal electrodes, an aperture ratio of the display panel can be increased.

In addition, in the structure illustrated in FIG. 10, the fourth sub-electrode may be a full-surface electrode, which simplifies the manufacturing process.

It should be noted that, the case that the pixel electrode 400 is arranged on the same layer as the source 260 and the drain 270 is illustrated in the embodiments shown in FIG. 9 and FIG. 10, which is not limited in the present disclosure. The pixel electrode 400 may also be arranged on the same layer as the gate or the active layer as described above.

Figure 11:
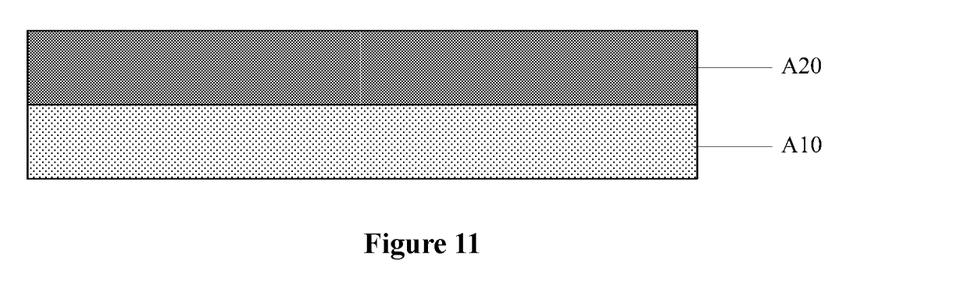
FIG. 11 is a schematic sectional view of a display panel according to an embodiment of the present disclosure.

A display panel is further provided according to an embodiment of the present disclosure. As illustrated in FIG. 11, the display panel includes an array substrate A10 and a counter substrate A20 opposite to each other. The array substrate A10 may be the array substrate according to any one of the above embodiments.

The counter substrate A20 may be a polarizer or a color filter substrate, which depends on types of light emitting units in display pixels on the array substrate A10. In a case that the light emitting units are LEDs emitting white light, the counter substrate A20 is required to be a color filter substrate to emit three primary colors of light. In a case that the light emitting units include LEDs emitting red light, LEDs emitting green light, and LEDs emitting blue light, the counter substrate A20 may be an optical film layer such as a polarizer, or a protection structure such as a protection film.

Figure 12:
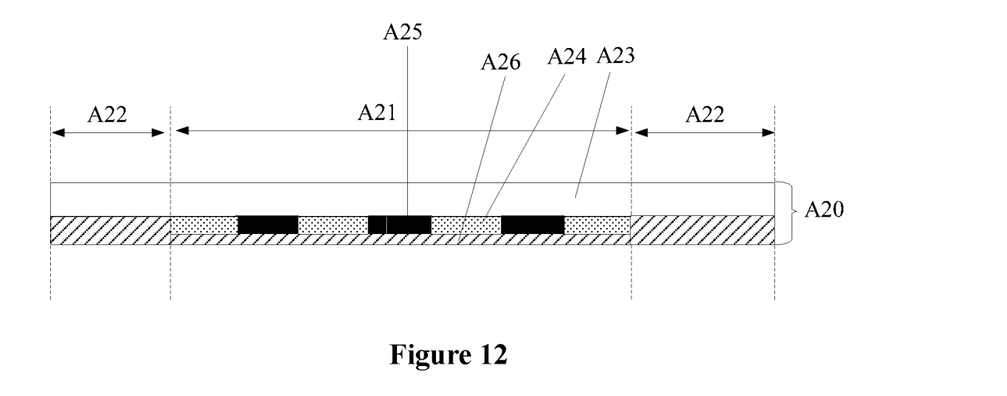
FIG. 12 is a schematic sectional view of a color filter substrate according to an embodiment of the present disclosure.

A specific structure of the color filter substrate is illustrated in an embodiment of the present disclosure. Reference is made to FIG. 12, which is a schematic sectional view of a color filter substrate.

The color filter substrate includes a second flexible substrate A23. The second flexible substrate A23 includes a color filter region A21 and a non-display region A22 surrounding the color filter region A21.

The color filter substrate further includes a black matrix layer A25 and a color filter layer A24 located on a side of the color filter region A21 facing towards the first flexible substrate.

The color filter substrate further includes a planarization structure A26 located on a side of the second flexible substrate A23 facing towards the first flexible substrate, with the planarization structure A26 covering the black matrix layer A25, the color filter layer A24, and a surface of the non-display region A22 of the second flexible substrate.

Similar to the first flexible substrate, the second flexible substrate A23 may include a corresponding foldable region.

Figure 13:
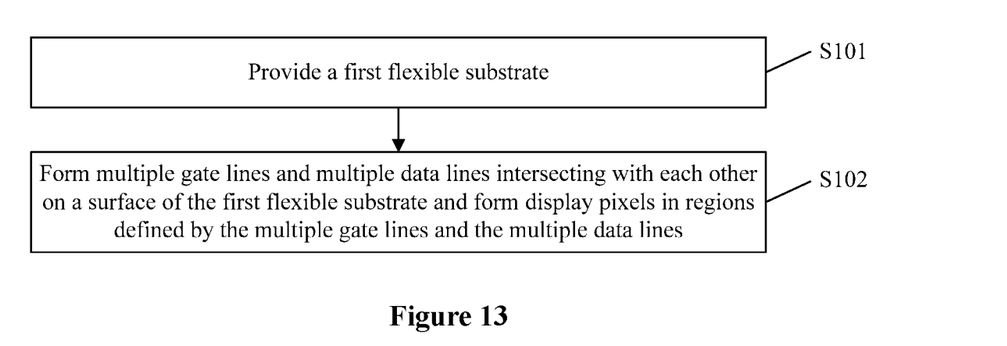
FIG. 13 is a flowchart of a method for manufacturing an array substrate according to an embodiment of the present disclosure.

A method for manufacturing an array substrate is further provided according to an embodiment of the present disclosure. Reference is made to FIG. 13, which is a flowchart of a method for manufacturing an array substrate. The method for manufacturing an array substrate includes the following steps S101 to S102.

In S101, a first flexible substrate is provided. The first flexible substrate includes a foldable region.

In S102, multiple gate lines and multiple data lines intersecting with each other are formed on a surface of the first flexible substrate, and display pixels are formed in regions defined by the multiple gate lines and the multiple data lines. Each of the display pixels includes a pixel circuit, a pixel electrode electrically connected to the pixel circuit, and a light emitting unit located on a side of the pixel electrode facing away from the first flexible substrate. The light emitting unit is electrically connected to the pixel electrode.

At least in the foldable region, the pixel electrode is arranged on the same layer as a drain of a thin film transistor of the pixel circuit.

In one embodiment, at least in the foldable region, the pixel electrode is arranged on the same layer as a gate of the thin film transistor of the pixel circuit.

In one embodiment, at least in the foldable region, the pixel electrode is arranged on the same layer as an active layer of the thin film transistor of the pixel circuit.

A sectional structure of the formed array substrate may be shown in FIG. 1 to FIG. 7. The pixel electrode is required to be electrically connected with the drain of the thin film transistor in the pixel circuit. In the array substrates shown in FIG. 2 and FIG. 3, since the pixel electrode is not located on the same layer as the drain of the thin film transistor, a drilling process is performed on an insulating layer between the active layer and the second metal layer (FIG. 3), or an insulating layer between the gate and the second metal layer (FIG. 2), such that the pixel electrode can be electrically connected with the drain of the thin film transistor through a via hole formed by the drilling process.

In the array substrate shown in FIG. 1, since the pixel electrode is located on the same layer as the source and the drain of the thin film transistor, the pixel electrode can be electrically connected with the drain of the thin film transistor by a patterning process without performing a drilling process, which simplifies the manufacturing process of the array substrate.

It should be noted that, in FIG. 1, FIG. 2 and FIG. 3, a thin film transistor with a top gate structure is illustrated by way of example. In the case of bottom gate structure, reference is made to FIG. 5, FIG. 6, and FIG. 7, which show possible structures of the array substrate. In the structure illustrated in FIG. 5, at least in the foldable region, the pixel electrode is arranged on the same layer as the drain of the thin film transistor of the pixel circuit. In one embodiment, in the structure illustrated in FIG. 6, at least in the foldable region, the pixel electrode is arranged on the same layer as the gate of the thin film transistor of the pixel circuit. In one embodiment, in the structure illustrated in FIG. 7, at least in the foldable region, the pixel electrode is arranged on the same layer as the active layer of the thin film transistor of the pixel circuit.

It should be noted that, whether in the thin film transistor with the top gate structure or in the thin film transistor with the bottom gate structure, both the active layer and the gate of the thin film transistor are closer to the first flexible substrate than the source and the drain of the thin film transistor. Therefore, the pixel electrode in each of the array substrates illustrated in FIG. 2, FIG. 3, FIG. 6 and FIG. 7 is closer to the first flexible substrate than that illustrated in FIG. 1 and FIG. 5, that is, the pixel electrode in FIG. 2, FIG. 3, FIG. 6 and FIG. 7 is closer to the neutral plane than that in FIG. 1 and FIG. 5. In this way, the bending stress at a bonding position between the light emitting unit and the pixel electrode during the bending possess can be reduced.

In addition, since a thin film transistor and a pixel electrode in the non-foldable region of the first flexible substrate are not required to be bended, the thin film transistor and the pixel electrode may be implemented by those in the conventional technology or may be implemented as shown in FIGS. 1 to 7, which are not limited in the present disclosure and may be determined according to actual situations.

A specific process of forming the gate lines, the data lines, and the display pixels on the array substrate shown in FIG. 1 to FIG. 3 is illustrated below by taking the thin film transistor with the top gate structure as an example.

Figure 14:
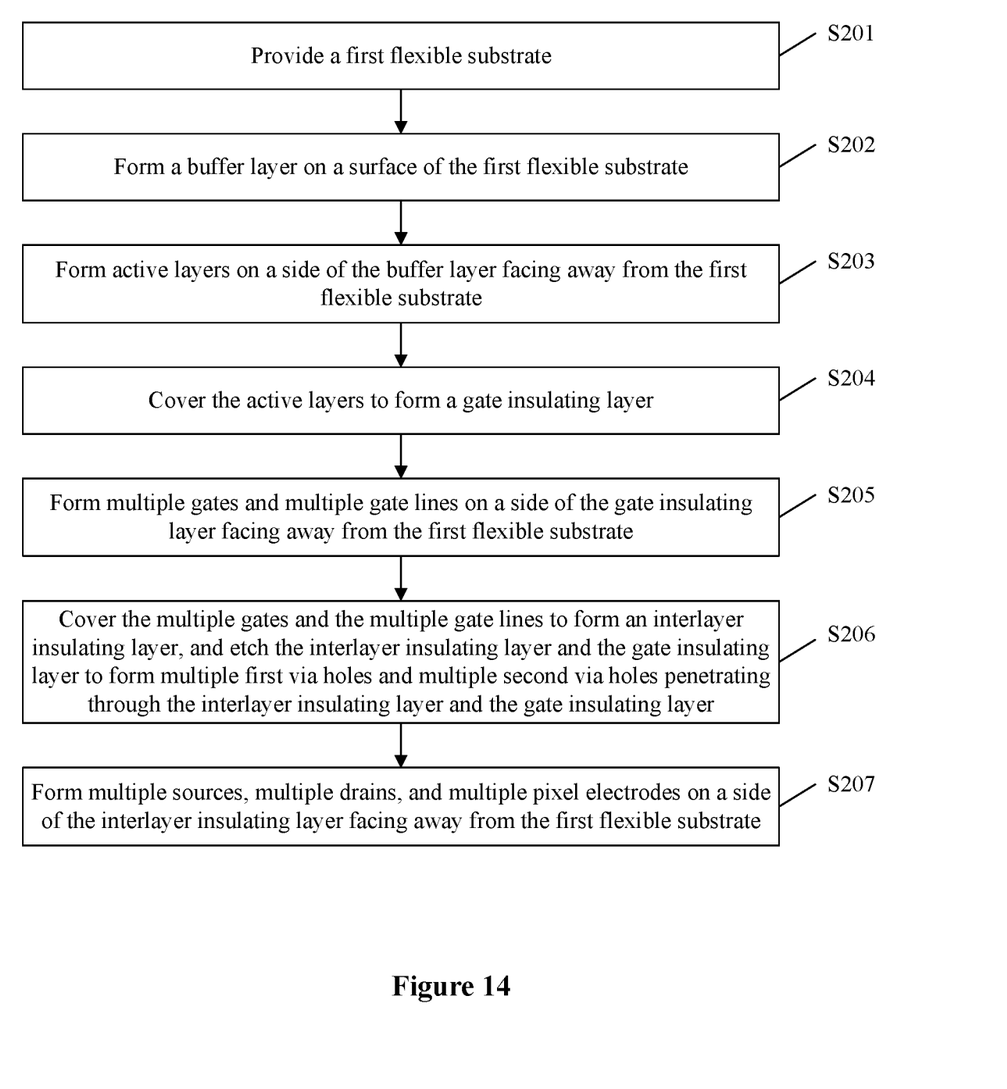
FIG. 14 is a flowchart of a method for manufacturing an array substrate according to another embodiment of the present disclosure.

For the array substrate illustrated in FIG. 1, reference is made to FIG. 14, which is a flowchart of a method for manufacturing an array substrate. The method for manufacturing an array substrate includes the following steps S201 to S207.

In S201, a first flexible substrate is provided. The first flexible substrate includes a foldable region.

In S202, a buffer layer is formed on a surface of the first flexible substrate.

In S203, active layers are formed on a side of the buffer layer facing away from the first flexible substrate. Each of the active layers includes a channel region, and a source region and a drain region located on two sides of the channel region.

In S204, the active layers are covered to form a gate insulating layer.

In S205, multiple gates and multiple gate lines are formed on a side of the gate insulating layer facing away from the first flexible substrate. At least one of the multiple gates is electrically connected to one of the multiple gate lines.

In S206, the multiple gates and the multiple gate lines are covered to form an interlayer insulating layer, and the interlayer insulating layer and the gate insulating layer are etched to form multiple first via holes and multiple second via holes penetrating through the interlayer insulating layer and the gate insulating layer. Each of the multiple first via holes exposes at least a part of the source region, and each of the multiple second via holes exposes at least a part of the drain region.

In S207, multiple sources, multiple drains and multiple pixel electrodes are formed on a side of the interlayer insulating layer facing away from the first flexible substrate. Each of the multiple sources is electrically connected to the source region via one of the multiple first via holes. Each of the multiple drains is electrically connected to the drain region via one of the multiple second via holes.

Figure 15:
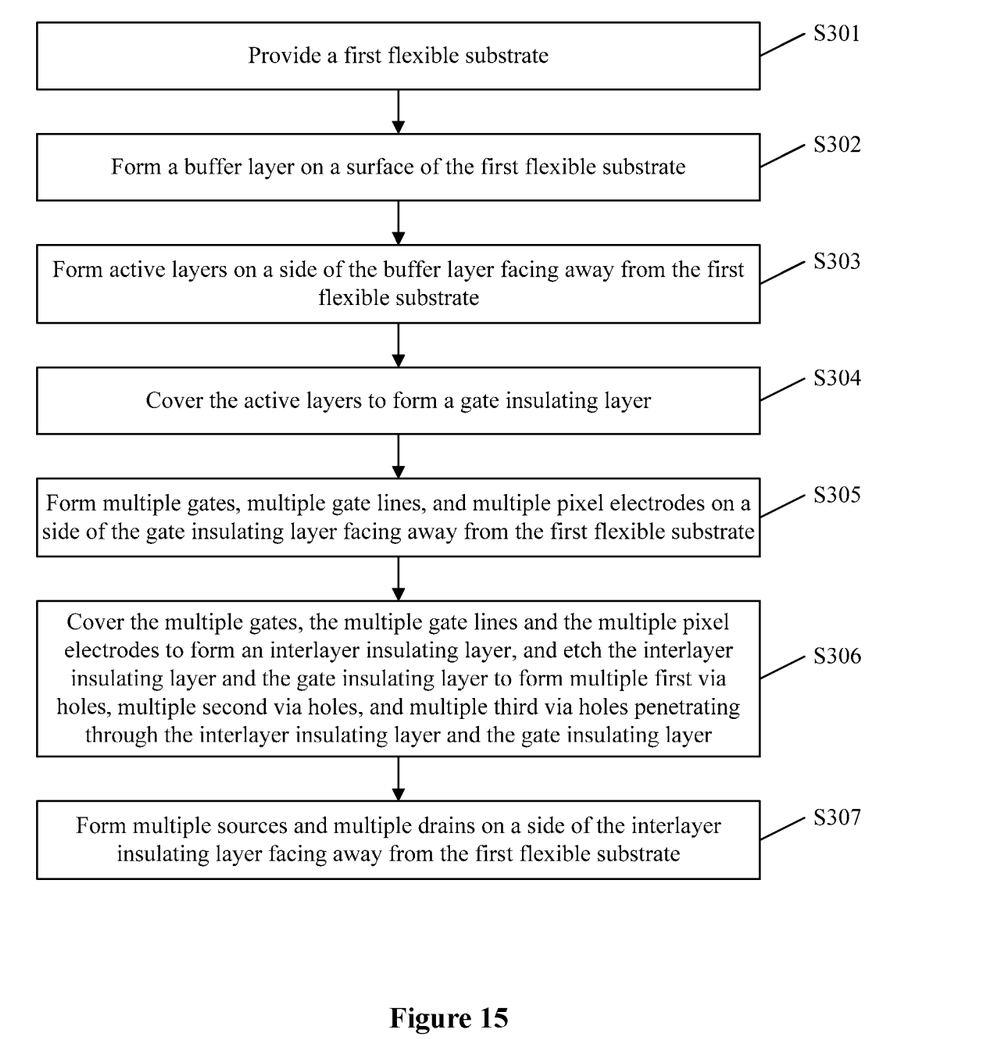
FIG. 15 is a flowchart of a method for manufacturing an array substrate according to another embodiment of the present disclosure.

For the array substrate illustrated in FIG. 2, reference is made to FIG. 15, which is a flowchart of a method for manufacturing an array substrate. The method for manufacturing an array substrate includes the following steps S301 to 307.

In S301, a first flexible substrate is provided. The first flexible substrate includes a foldable region.

In S302, a buffer layer is formed on a surface of the first flexible substrate.

In S303, active layers are formed on a side of the buffer layer facing away from the first flexible substrate. Each of the active layers includes a channel region, and a source region and a drain region located on two sides of the channel region.

In S304, the active layers are covered to form a gate insulating layer.

In S305, multiple gates, multiple gate lines and multiple pixel electrodes are formed on a side of the gate insulating layer facing away from the first flexible substrate. At least one of the multiple gates is electrically connected to one of the multiple gate lines.

In S306, the multiple gates, the multiple gate lines and the multiple pixel electrodes are covered to form an interlayer insulating layer, and the interlayer insulating layer and the gate insulating layer are etched to form multiple first via holes, multiple second via holes and multiple third via holes penetrating through the interlayer insulating layer and the gate insulating layer. Each of the multiple first via holes exposes at least a part of the source region, each of the multiple second via holes exposes at least a part of the drain region, and each of the multiple third via holes exposes at least a part of one of the multiple pixel electrodes.

In S307, multiple sources and multiple drains are formed on a side of the interlayer insulating layer facing away from the first flexible substrate. Each of the multiple sources is electrically connected to the source region via one of the multiple first via holes. Each of the multiple drains is electrically connected to the drain region via one of the multiple second via holes and is electrically connected to one of the multiple pixel electrodes via one of the multiple third via holes.

The method according to this embodiment differs from the method for manufacturing the array substrate illustrated in FIG. 1 mainly in steps S305 and S205, and S306 and S206. In the method for manufacturing the array substrate illustrated in FIG. 2, the pixel electrodes and the gates are formed by a same patterning process. Further, since the pixel electrode and the drain are not on a same layer, the third via hole is further formed to expose at least a part of the pixel electrode, in addition to the first via hole exposing at least a part of the source region, the second via hole exposing at least a part of the drain region, such that the pixel electrode can be electrically connected to the drain via the third via hole in S307.

Figure 16:
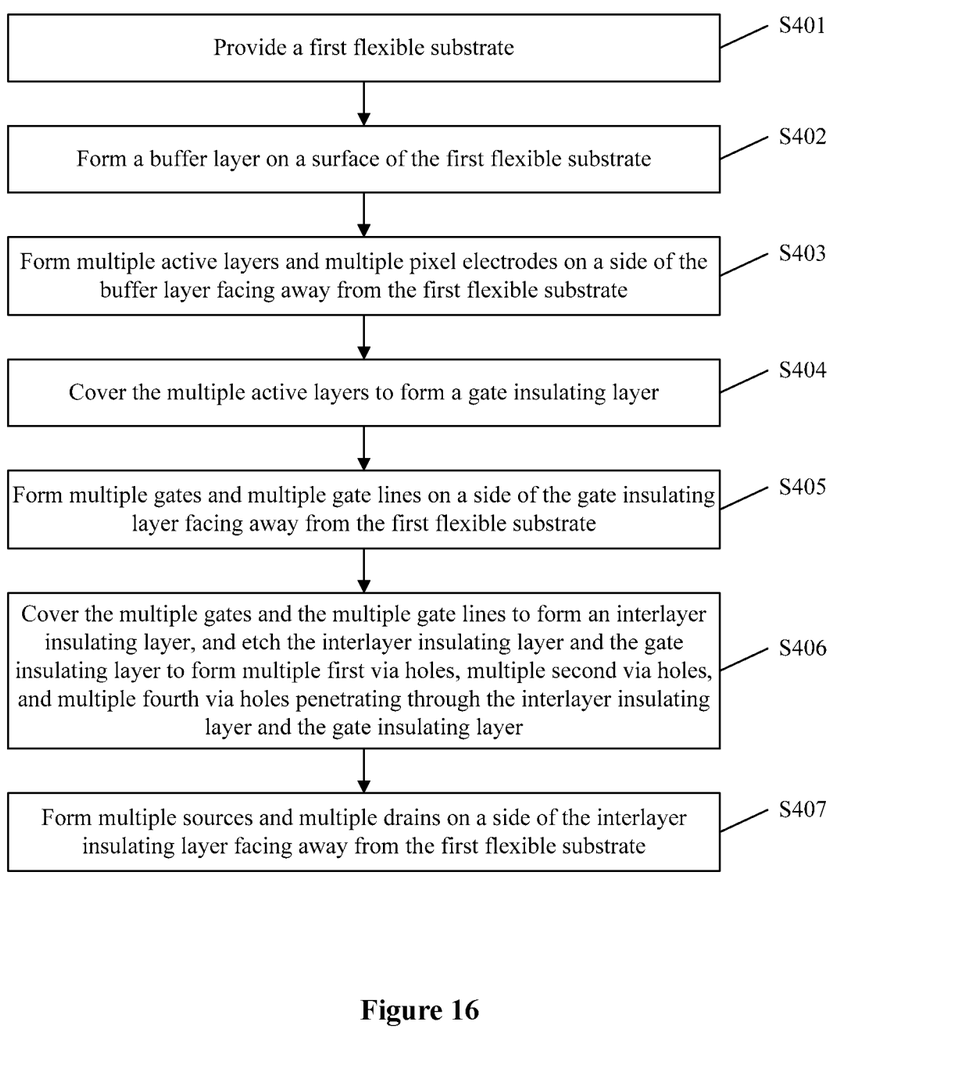
FIG. 16 is a flowchart of a method for manufacturing an array substrate according to another embodiment of the present disclosure.

For the array substrate illustrated in FIG. 3, reference is made to FIG. 16, which is a flowchart of a method for manufacturing an array substrate. The method for manufacturing an array substrate includes the following steps S401 to S407.

In S401, a first flexible substrate is provided. The first flexible substrate includes a foldable region.

In S402, a buffer layer is formed on a surface of the first flexible substrate.

In S403, multiple active layers and multiple pixel electrodes are formed on a side of the buffer layer facing away from the first flexible substrate. Each of the multiple active layers includes a channel region, and a source region and a drain region located on two sides of the channel region.

In S404, the multiple active layers are covered to form a gate insulating layer.

In S405, multiple gates and multiple gate lines are formed on a side of the gate insulating layer facing away from the first flexible substrate. At least one of the multiple gates is electrically connected to one of the multiple gate lines.

In S406, the multiple gates and the multiple gate lines are covered to form an interlayer insulating layer, and the interlayer insulating layer and the gate insulating layer are etched to form multiple first via holes, multiple second via holes and multiple fourth via holes penetrating through the interlayer insulating layer and the gate insulating layer. Each of the multiple first via holes exposes at least a part of the source region, each of the multiple second via holes exposes at least a part of the drain region, and each of the multiple fourth via holes exposes at least a part of one of the multiple pixel electrodes.

In S407, multiple sources and multiple drains are formed on a side of the interlayer insulating layer facing away from the first flexible substrate. Each of the multiple sources is electrically connected to the source region via one of the multiple first via holes, each of the multiple drains is electrically connected to the drain region via one of the multiple second via holes, and each of the multiple drains is electrically connected to one of the multiple pixel electrodes via one of the multiple fourth via holes.

The method according to this embodiment differs from the method for manufacturing the array substrate illustrated in FIG. 1 mainly in steps S403 and S203, and S406 and S206. In the method for manufacturing the array substrate illustrated in FIG. 3, the pixel electrodes and the gates are formed by a same patterning process. Further, since the pixel electrode and the drain are not on a same layer, the fourth via hole is further formed to expose at least a part of the pixel electrode, in addition to the first via hole exposing at least a part of the source region and the second via hole exposing at least a part of the drain region, such that the pixel electrode can be electrically connected to the drain via the fourth via hole in S407.

In the array substrate, the method for manufacturing an array substrate, and the display panel according to the embodiments of the present disclosure, the first flexible substrate of the array substrate includes a foldable region. At least in the foldable region, the pixel electrode is arranged on the same layer as the drain, the gate or the active layer of the thin film transistor of the pixel circuit, to decrease a distance between the pixel electrode and the first flexible substrate, so as to decrease a distance between the pixel electrode and the neutral plane. In this way, a distance between a bonding position between the light emitting and the pixel electrode and the neutral plane can be decreased, such that the bending stress at the bonding position between the light emitting unit and the pixel electrode during the bending process can be reduced, and a probability that the light emitting unit peels off from the pixel electrode during the use can be decreased, thereby improving the stability and the durability of the array substrate.

It should be noted that the embodiments in this specification are described in a progressive manner, each of the embodiments emphasizes differences from other embodiments, and the same or similar parts among the embodiments can be referred to each other.

The invention claimed is:

1. An array substrate, comprising:
   a first flexible substrate comprising a foldable region;
   a plurality of gate lines and a plurality of data lines intersecting with each other located on a surface of the first flexible substrate; and
   display pixels located in regions defined by the plurality of gate lines and the plurality of data lines, each comprising a pixel circuit, a pixel electrode electrically connected to the pixel circuit, and a light emitting unit located on a side of the pixel electrode facing away from the first flexible substrate, the light emitting unit being electrically connected to the pixel electrode, wherein
   at least in the foldable region,
   the pixel electrode and a drain of a thin film transistor of the pixel circuit are arranged on a same layer; or
   the pixel electrode and a gate of the thin film transistor of the pixel circuit are arranged on a same layer; or
   the pixel electrode and an active layer of the thin film transistor of the pixel circuit are arranged on a same layer.

2. The array substrate according to claim 1, wherein the light emitting unit is a vertical light-emitting diode (LED) or a horizontal LED.

3. The array substrate according to claim 2, wherein the pixel electrode comprises:
   a first sub-electrode; and
   a second sub-electrode, wherein
   the first sub-electrode and the second sub-electrode are arranged on a same layer, one side of the first sub-electrode is electrically connected to a drain of the thin film transistor, and the other side of the first sub-electrode is electrically connected to an anode of the light emitting unit; and
   the second sub-electrode is electrically connected to a cathode of the light emitting unit.

4. The array substrate according to claim 3, wherein the first sub-electrode is a conductive thin film electrode, and the second sub-electrode is a metal electrode.

5. The array substrate according to claim 2, wherein the pixel electrode comprises:
   a third sub-electrode and a fourth sub-electrode opposite to each other, wherein
   one side of the third sub-electrode is electrically connected to a drain of the thin film transistor, and the other side of the third sub-electrode is electrically connected to an anode of the light emitting unit; and
   the fourth sub-electrode is arranged on a side of the light emitting unit facing away from the pixel circuit, and is electrically connected to a cathode of the light emitting unit.

6. The array substrate according to claim 5, wherein both the third sub-electrode and the fourth sub-electrode are conductive thin film electrodes.

7. The array substrate according to claim 1, wherein the thin film transistor comprises:

a buffer layer located on a side of the first flexible substrate;

an active layer located on a side of the buffer layer facing away from the first flexible substrate, comprising a channel region, and a source region and a drain region located on two sides of the channel region;

a gate insulating layer covering the active layer;

a gate located on a side of the gate insulating layer facing away from the first flexible substrate;

an interlayer insulating layer covering the gate; and a source and a drain located on a side of the interlayer insulating layer facing away from the first flexible substrate, wherein the source is electrically connected to the source region, and the drain is electrically connected to the drain region.

8. The array substrate according to claim 1, wherein the thin film transistor comprises:

a gate located on a side of the first flexible substrate;

a gate insulating layer covering the gate;

an active layer located on a side of the gate insulating layer facing away from the first flexible substrate, comprising a channel region, and a source region and a drain region located on two sides of the channel region;

an interlayer insulating layer covering the active layer; and a source and a drain located on a side of the interlayer insulating layer facing away from the first flexible substrate, wherein the source is electrically connected to the source region, and the drain is electrically connected to the drain region.

9. The array substrate according to claim 7, wherein in a case that the pixel electrode and the active layer of the thin film transistor of the pixel circuit are arranged on a same layer, the pixel electrode is a semiconductor electrode, and a carrier concentration of the semiconductor electrode is higher than a carrier concentration of the active layer.

10. The array substrate according to claim 8, wherein in a case that the pixel electrode and the active layer of the thin film transistor of the pixel circuit are arranged on a same layer, the pixel electrode is a semiconductor electrode, and a carrier concentration of the semiconductor electrode is higher than a carrier concentration of the active layer.

11. The array substrate according to claim 1, further comprises:

a planarization layer located on a side of the pixel circuit facing away from the first flexible substrate.

12. The array substrate according to claim 11, further comprises:

a thin film encapsulation located on a side of the first flexible substrate and configured to encapsulate the plurality of gate lines, the plurality of data lines, the display pixels and the planarization layer.

13. A display panel, comprising:

an array substrate and a counter substrate opposite to each other, wherein the array substrate comprises:

a first flexible substrate comprising a foldable region;

a plurality of gate lines and a plurality of data lines intersecting with each other located on a surface of the first flexible substrate; and display pixels located in regions defined by the plurality of gate lines and the plurality of data lines, each comprising a pixel circuit, a pixel electrode electrically connected to the pixel circuit, and a light emitting unit located on a side of the pixel electrode facing away from the first flexible substrate, the light emitting unit being electrically connected to the pixel electrode, wherein at least in the foldable region, the pixel electrode and a drain of a thin film transistor of the pixel circuit are arranged on a same layer; or the pixel electrode and a gate of the thin film transistor of the pixel circuit are arranged on a same layer; or the pixel electrode and an active layer of the thin film transistor of the pixel circuit are arranged on a same layer.

14. The display panel according to claim 13, wherein the counter substrate is a polarizer or a color filter substrate.

15. The display panel according to claim 14, wherein the color filter substrate comprises:

a second flexible substrate comprising a color filter region and a non-display region surrounding the color filter region;

a black matrix layer and a color filter layer located on a side of the color filter region facing towards the first flexible substrate; and a planarization structure located on a side of the second flexible substrate facing towards the first flexible substrate, with the planarization structure covering the black matrix layer, the color filter layer, and a surface of the non-display region of the second flexible substrate.

16. A method for manufacturing an array substrate, comprising:

providing a first flexible substrate, wherein the first flexible substrate comprises a foldable region; and forming a plurality of gate lines and a plurality of data lines intersecting with each other on a surface of the first flexible substrate and forming display pixels in regions defined by the plurality of gate lines and the plurality of data lines, wherein each of the display pixels comprises a pixel circuit, a pixel electrode electrically connected to the pixel circuit, and a light emitting unit located on a side of the pixel electrode facing away from the first flexible substrate, and the light emitting unit is electrically connected to the pixel electrode, wherein at least in the foldable region, the pixel electrode and a drain of a thin film transistor of the pixel circuit are arranged on a same layer; or the pixel electrode and a gate of the thin film transistor of the pixel circuit are arranged on a same layer; or the pixel electrode and an active layer of the thin film transistor of the pixel circuit are arranged on a same layer.

17. The method according to claim 16, wherein the forming a plurality of gate lines and a plurality of data lines intersecting with each other on a surface of the first flexible substrate and forming display pixels in regions defined by the plurality of gate lines and the plurality of data lines comprises:

forming a buffer layer on a surface of the first flexible substrate;

forming active layers on a side of the buffer layer facing away from the first flexible substrate, wherein each of the active layers comprises a channel region, and a source region and a drain region located on two sides of the channel region;

covering the active layers to form a gate insulating layer;

forming a plurality of gates and the plurality of gate lines on a side of the gate insulating layer facing away from the first flexible substrate, wherein at least one of the plurality of gates is electrically connected to one of the plurality of gate lines;

covering the plurality of gates and the plurality of gate lines to form an interlayer insulating layer, and etching the interlayer insulating layer and the gate insulating layer to form a plurality of first via holes and a plurality of second via holes penetrating through the interlayer insulating layer and the gate insulating layer, wherein each of the plurality of first via holes exposes at least a part of the source region, and each of the plurality of second via holes exposes at least a part of the drain region; and forming a plurality of sources, a plurality of drains, and the plurality of pixel electrodes on a side of the interlayer insulating layer facing away from the first flexible substrate, wherein each of the plurality of sources is electrically connected to the source region via one of the plurality of first via holes, and each of the plurality of drains is electrically connected to the drain region via one of the plurality of second via holes.

18. The method according to claim 16, wherein the forming a plurality of gate lines and a plurality of data lines intersecting with each other on a surface of the first flexible substrate and forming display pixels in regions defined by the plurality of gate lines and the plurality of data lines comprises:

forming a buffer layer on a surface of the first flexible substrate;

forming active layers on a side of the buffer layer facing away from the first flexible substrate, wherein each of the active layers comprises a channel region, and a source region and a drain region located on two sides of the channel region;

covering the active layers to form a gate insulating layer;

forming a plurality of gates, the plurality of gate lines, and a plurality of pixel electrodes on a side of the gate insulating layer facing away from the first flexible substrate, wherein at least one of the plurality of gates is electrically connected to one of the plurality of gate lines;

covering the plurality of gates, the plurality of gate lines and the plurality of pixel electrodes to form an interlayer insulating layer, and etching the interlayer insulating layer and the gate insulating layer to form a plurality of first via holes, a plurality of second via holes and a plurality of third via holes penetrating through the interlayer insulating layer and the gate insulating layer, wherein each of the plurality of first via holes exposes at least a part of the source region, each of the plurality of second via holes exposes at least a part of the drain region, and each of the plurality of third via holes exposes at least a part of one of the plurality of pixel electrodes; and forming a plurality of sources and a plurality of drains on a side of the interlayer insulating layer facing away from the first flexible substrate, wherein each of the plurality of sources is electrically connected to the source region via one of the plurality of first via holes, and each of the plurality of drains is electrically connected to the drain region via one of the plurality of second via holes and is electrically connected to one of the plurality of pixel electrodes via one of the plurality of third via holes.

19. The method according to claim 16, wherein the forming a plurality of gate lines and a plurality of data lines intersecting with each other on a surface of the first flexible substrate and forming display pixels in regions defined by the plurality of gate lines and the plurality of data lines comprises:

forming a buffer layer on a surface of the first flexible substrate;

forming a plurality of active layers and a plurality of pixel electrodes on a side of the buffer layer facing away from the first flexible substrate, wherein each of the plurality of active layers comprises a channel region, and a source region and a drain region located on two sides of the channel region;

covering the plurality of active layers to form a gate insulating layer;

forming a plurality of gates and the plurality of gate lines on a side of the gate insulating layer facing away from the first flexible substrate, wherein at least one of the plurality of gates is electrically connected to one of the plurality of gate lines;

covering the plurality of gates and the plurality of gate lines to form an interlayer insulating layer, and etching the interlayer insulating layer and the gate insulating layer to form a plurality of first via holes, a plurality of second via holes and a plurality of fourth via holes penetrating through the interlayer insulating layer and the gate insulating layer, wherein each of the plurality of first via holes exposes at least a part of the source region, each of the plurality of second via holes exposes at least a part of the drain region, and each of the plurality of fourth via holes exposes at least a part of one of the plurality of pixel electrodes; and forming a plurality of sources and a plurality of drains on a side of the interlayer insulating layer facing away from the first flexible substrate, wherein each of the plurality of sources is electrically connected to the source region via one of the plurality of first via holes, and each of the plurality of drains is electrically connected to the drain region via one of the plurality of second via holes and is electrically connected to one of the plurality of pixel electrodes via one of the plurality of fourth via holes.

* * * * *